US012660082B2

(12) United States Patent
     Goulier

(10) Patent No.:   US 12,660,082 B2
(45) Date of Patent:       Jun. 16, 2026

(54) ELECTRONIC CIRCUIT FOR A VEHICLE

(71) Applicant: Vitesco Technologies GmbH,
               Regensburg (DE)

(72) Inventor:  Emmanuel Goulier, Toulouse (FR)

(73) Assignee: **Schaeffler Technologies AG & Co.
               KG**, Herzogenaurach (DE)

( * ) Notice:   Subject to any disclaimer, the term of this
               patent is extended or adjusted under 35
               U.S.C. 154(b) by 198 days.

(21) Appl. No.:  18/716,183

(22) PCT Filed:  Dec. 7, 2022

(86) PCT No.:    PCT/EP2022/084838
     § 371 (c)(1),
     (2) Date:   Jun. 4, 2024

(87) PCT Pub. No.: WO2023/110588
     PCT Pub. Date: Jun. 22, 2023

(65)            Prior Publication Data
     US 2025/0040035 A1      Jan. 30, 2025

(30)       Foreign Application Priority Data
     Dec. 17, 2021   (FR) ...................................... 2113760

(51) Int. Cl.
     *H05K 1/02*          (2006.01)
     *H02M 1/00*          (2006.01)
                (Continued)
(52) U.S. Cl.
     CPC .......... *H05K 1/025* (2013.01); *H02M 1/0006*
            (2021.05); *H02M 1/08* (2013.01);
                (Continued)

(58) Field of Classification Search
     CPC ...... H05K 1/025; H02M 1/0006; H02M 1/08;
                                          H02M 1/4233
                (Continued)

(56)            References Cited

U.S. PATENT DOCUMENTS 8,558,586 B1   10/2013   Koeppl et al.
     9,036,364 B1 *  5/2015   Fung ...................... H05K 1/025
                                              174/255
                (Continued)

FOREIGN PATENT DOCUMENTS

WO        2018181212 A1    10/2018

OTHER PUBLICATIONS

International Search Report (PCT/ISA/210) with English translation
and Written Opinion (PCT/ISA/237) mailed on Mar. 3, 2023, by the
European Patent Office as the International Searching Authority for
International Application No. PCT/EP2022/084838, 16 pages.

*Primary Examiner* — Andargie M Aychillhum
(74) *Attorney, Agent, or Firm* — Buchanan Ingersoll &
Rooney PC

(57)            ABSTRACT
An electronic circuit, including: a switching cell including a
first switch, referred to as a "high-side" switch, and a second
switch, referred to as a "low-side" switch, that are connected
to one another by an intermediate wired link; a control
module for controlling the switching cell, including a first,
a second and a third connection terminal; the intermediate
wired link including a fourth connection terminal and a fifth
connection terminal; a second wired link configured to
connect the second connection terminal and the fourth
connection terminal; a third wired link that is separate from
the second wired link and configured to connect the control
capacitor between the third terminal and the fifth terminal.

11 Claims, 3 Drawing Sheets

(51) Int. Cl.
  _H02M 1/08_          (2006.01)
  _H02M 1/42_          (2007.01)

(52) U.S. Cl.
  CPC ........ _H02M 1/4233_ (2013.01); _H05K 1/0228_
      (2013.01); _H05K 1/0243_ (2013.01); _H05K_
      _2201/09236_ (2013.01)

(58) Field of Classification Search
  USPC ......................................................... 174/262
  See application file for complete search history.

(56)                  References Cited

U.S. PATENT DOCUMENTS

|             |     |         |                      |
| ----------- | --- | ------- | -------------------- |
| 10,454,472  | B2  | 10/2019 | Reusch et al.        |
| 2004/0227547 | A1  | 11/2004 | Shiraishi et al.     |
| 2005/0110556 | A1  | 5/2005  | Guedon               |
| 2006/0113657 | A1  | 6/2006  | Ejury                |
| 2018/0062321 | A1* | 3/2018  | Blin ................... H01R 13/6471 |

* cited by examiner

Fig. 3

ELECTRONIC CIRCUIT FOR A VEHICLE

CROSS REFERENCE TO RELATED APPLICATIONS

This application is the U.S. National Phase Application of PCT International Application No. PCT/EP2022/084838, filed Dec. 7, 2022, which claims priority to French Patent Application No. 2113760, filed Dec. 17, 2021, the contents of such applications being incorporated by reference herein.

FIELD OF THE INVENTION

The invention relates to the field of printed circuits for converters for a motor vehicle.

BACKGROUND OF THE INVENTION

As is known, an electric or hybrid vehicle comprises an on-board charger, which itself comprises a power factor correction circuit, in other words an AC-DC voltage converter.

The power factor correction circuit comprises a plurality of switching cells.

With reference to FIG. 1, each switching cell comprises two switches T1, T2 that are connected to one another at a midpoint PM. A first switch T1 is referred to as a "high-side" switch and is also connected to a DC supply voltage $V_{alim}$. The second switch T2 is referred to as a "low-side" switch and is also connected to a ground.

Furthermore, each switching cell is connected to a control module 30 for controlling the switches and to a boot circuit. Each boot circuit comprises in particular a capacitor C, commonly called a "bootstrap" capacitor by those skilled in the art, which is connected to the midpoint PM.

More precisely, when the low-side switch T2 is closed and the high-side switch T1 is open, the capacitor C charges. Conversely, when the low-side switch T2 is open and the high-side switch T1 is closed, the capacitor C discharges.

The control module 30 comprises three connection terminals B1, B2, B3. The second terminal B2 is used to provide the logic control voltage, commonly designated "Vss" by those skilled in the art.

A first electronic track P1 of the printed circuit connects the high-side switch T1 to the control module 30 via the first terminal B1 in order to control the high-side switch T1.

A second electronic track P2 of the printed circuit connects the second terminal B2 to the midpoint PM. Furthermore, a third electronic track P3 is used to connect the capacitor C of the boot circuit between the third terminal B3 and the second track P2.

Thus, the second track P2 is used to connect the midpoint PM both to the second terminal B2 and to the capacitor C, allowing space to be saved on the printed circuit.

However, with reference to FIG. 2, this second track P2 generates a parasitic inductance $L_p$ that can cause malfunctions in the switching of the switches.

Preferably, when the switching cell operates in boost mode, in which the output voltage provided by the switching cell is greater than the input voltage, a voltage is generated across the terminals of the parasitic inductance $L_p$ when the high-side switch T1 opens or when the low-side switch T2 closes. This generated voltage is applied directly to the terminals of the high-side switch T1, which could cause the high-side switch T1 to partially close or to open more slowly. This may likewise cause the electronic components to overheat because the DC supply voltage could be connected to ground at times.

Furthermore, when the switching cell operates in buck mode, in which the output voltage provided by the cell is lower than or equal to the input voltage, and the high-side switch T1 opens and the low-side switch T2 is closed, a voltage is generated across the terminals of the parasitic inductance $L_p$, which reduces the voltage applied to the terminals of the capacitor C, can prevent the high-side transistor T1 from being correctly controlled and can increase switching losses.

There is therefore a need for a solution that makes it possible to overcome the above-mentioned problems at least in part.

SUMMARY OF THE INVENTION

To this end, an aspect of the invention relates to an electronic circuit, in particular for a motor vehicle, comprising:

a. a switching cell comprising a first switch, referred to as a "high-side" switch, and a second switch, referred to as a "low-side" switch, that are connected to one another by an intermediate wired link, the high-side switch also being connected to a DC supply voltage, and the low-side switch also being connected to a ground, b. a control module for controlling the switching cell, said control module comprising a first connection terminal, a second connection terminal and a third connection terminal, c. a control capacitor, d. said intermediate wired link comprising a fourth connection terminal and a fifth connection terminal, e. a first wired link configured to connect the first connection terminal of the control module to the first switch, f. a second wired link configured to connect the second connection terminal and the fourth connection terminal, g. the electronic circuit is noteworthy in that it comprises a third wired link that is separate from the second wired link and configured to connect the control capacitor between the third terminal and the fifth terminal.

Thus, the third wired link is separated from the second wired link. In other words, the third wired link is not in contact with the second wired link. The second wired link generates a parasitic inductance. The third wired link generates a second parasitic inductance. However, the first parasitic inductance only influences the part of the electrical circuit comprising the high-side switch. The second parasitic inductance does not influence the part of the electrical circuit comprising the low-side switch and the control capacitor. The parasitic inductances generated therefore do not influence the whole electronic circuit.

More preferably, the electronic circuit comprises a diode, commonly called a "bootstrap diode", which is connected firstly to the control capacitor and secondly to an auxiliary power supply device.

More preferably, each wired link extends in a substantially linear manner over a surface of said electronic circuit. This configuration allows space to be saved on the circuit.

Advantageously, a first portion of the second wired link and a portion of the third wired link extend linearly and parallel with respect to one another and are spaced apart by a predefined minimum distance. The minimum distance therefore makes it possible to avoid any electrical coupling and therefore any disturbance between the second wired link and the third wired link.

More advantageously, a second portion of the second wired link and a second portion of the third wired link are oriented perpendicularly with respect to one another.

Advantageously, the minimum distance is defined according to the type of switch, the power involved, the frequency of the signals transmitted by the switching cell, the slew rate of the switching cell and the control signal of each switch.

Preferably, the intermediate wired link extends linearly between the high-side switch and the low-side switch, the fourth connection terminal is positioned on the intermediate wired link so as to be positioned closer to the high-side switch, and the fifth connection terminal is positioned so as to be placed between the fourth connection terminal and the low-side switch.

Advantageously, the fourth connection terminal and the fifth connection terminal are spaced apart by a distance at least equal to the predefined minimum distance. Thus, the first wired link and the second wired link are not in contact with one another.

More preferably, each wired link corresponds to a printed electronic track on the electronic circuit.

Preferably, each switch corresponds to a transistor, preferably a MOSFET field-effect transistor, an insulated-gate bipolar transistor, or IGBT transistor, a thyristor, a GTO (gate turn-off) thyristor, a cascode assembly, a JFET (junction field-effect transistor) transistor, or any type of switch able to be used for a switching cell as described above.

An aspect of the invention also relates to an on-board charger comprising a converter comprising at least one electronic circuit as presented above.

An aspect of the invention also relates to a motor vehicle comprising an electronic circuit as presented above or an on-board charger as presented above.

BRIEF DESCRIPTION OF THE DRAWINGS

Further features and advantages of aspects of the invention will become more clearly apparent upon reading the following description. This description is purely illustrative and should be read with reference to the appended drawings, in which:

FIG. 3 shows the topology of an electronic switching circuit according to an aspect of the invention that is intended to be installed in a vehicle.

DETAILED DESCRIPTION OF THE EXEMPLARY EMBODIMENTS

Vehicle

Figure 1:
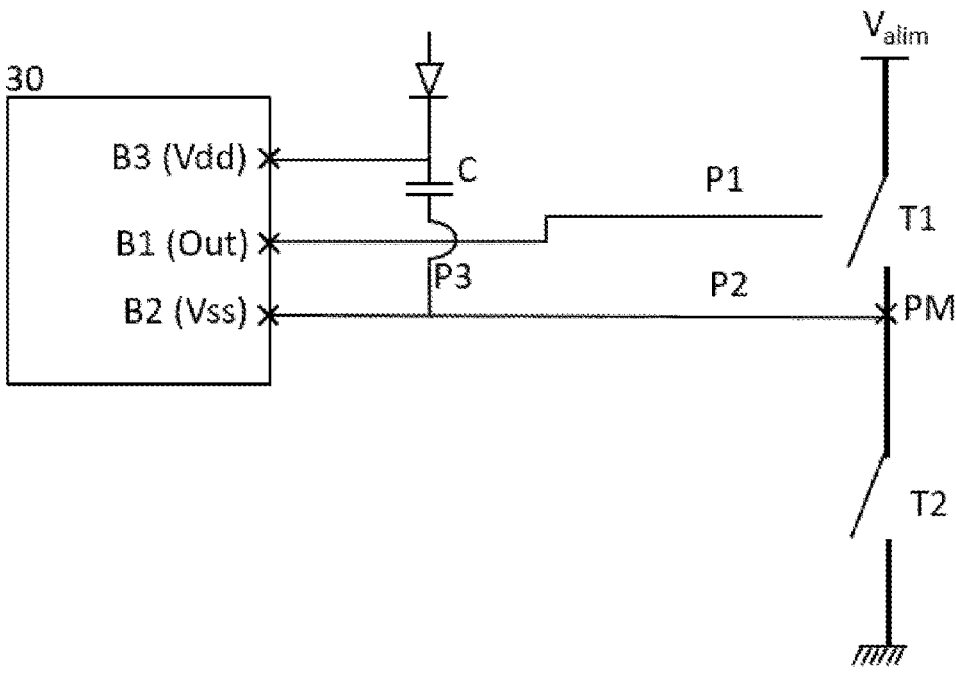
FIG. 1 shows the topology of an electronic switching circuit according to the prior art that is intended to be installed in a vehicle.
Figure 2:
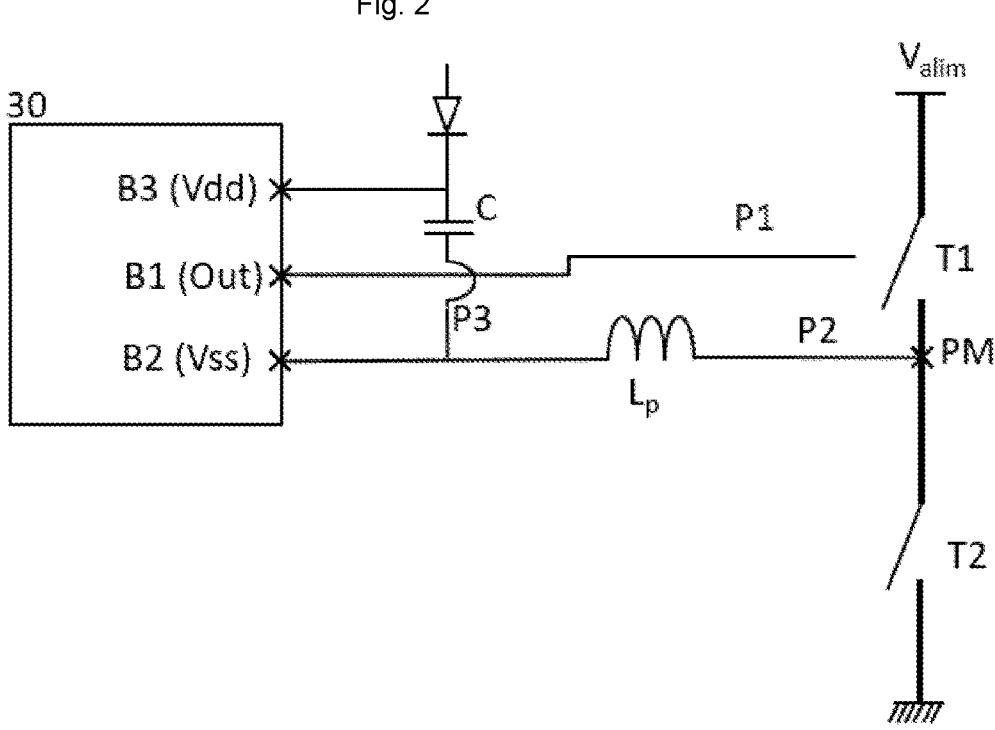
FIG. 2 shows the equivalent circuit of the electronic switching circuit according to FIG. 1.

The vehicle comprises a vehicle on-board charger, as it is known in particular to those skilled in the art. The on-board charger comprises a power factor correction circuit and a DC-DC voltage converter. The power factor correction circuit and the DC-DC voltage converter comprise at least one switching cell.

Figure 3:
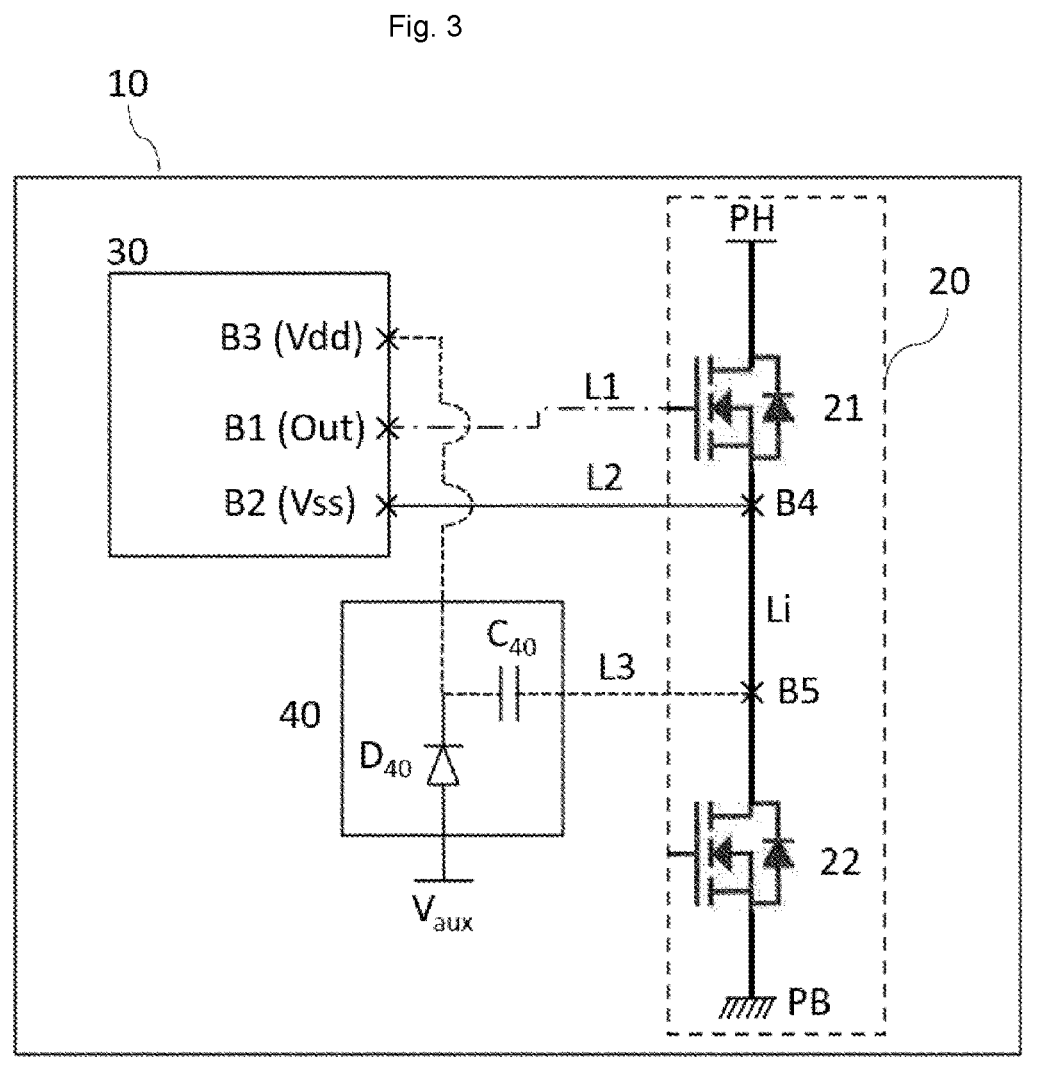

More precisely, with reference to FIG. 3, the on-board charger comprises an electrical circuit 10 on which the at least one switching cell 20 of the power factor correction circuit or of the DC-DC voltage converter is installed. In order to simplify the description, an aspect of the invention is described for an electrical circuit 10 comprising only a single switching cell 20. The electrical circuit 10 comprising the at least one switching cell 20 can likewise be used in cases other than that of an on-board charger.

Switching Cell 20

Also shown is the detailed structure of a switching cell 20 comprising a first switch, referred to as a "high-side" switch, 21 and a second switch, referred to as a "low-side" switch, 22 that is electrically connected to said high-side switch 21. The high-side switch 21 is also electrically connected to a high point PH. The low-side switch 22 is also connected to a low point PB.

The high point PH is in particular connected to a constant supply voltage, for example approximately equal to 400 V. Conversely, the low point PB is connected to a ground.

Control Module 30

Furthermore, the electrical circuit 10 comprises a control module 30 for controlling the switching cell 20, and more precisely a control module 30 for controlling the opening and closing of the high-side switch 21 and the low-side switch 22. The control module 30 is therefore able to control the opening and closing of the high-side switch 21 and the low-side switch 22 alternately. In other words, the control module 30 controls the closing of the high-side switch 21 simultaneously with the opening of the low-side switch 22, and the opening of the high-side switch 21 simultaneously with the closing of the low-side switch 22, respectively.

Even more precisely, the control module 30 comprises a first connection terminal B1, a second connection terminal B2 and a third connection terminal B3.

The connection terminals B1, B2, B3 are in particular aligned. Preferably, the connection terminals are aligned in the following order: the third connection terminal B3, the first connection terminal B1 and the second connection terminal B2.

According to one embodiment, the control module 30 comprises said connection terminals B1, B2, B3. In other words, in the present case, the connection terminals B1, B2, B3 are output connectors of the control module 30.

The first connection terminal B1 is commonly called the "Out" terminal by those skilled in the art. The second connection terminal B2 is commonly designated "Vss" by those skilled in the art. Finally, the third connection terminal B3 is commonly designated "Vdd" by those skilled in the art.

The detailed structure of the switching cell 20 and the connections between the switching cell 20 and the control module 30 will now be presented. The high-side switch 21 and the low-side switch 22 correspond, for example, to a transistor, and in particular a MOSFET field-effect transistor, an insulated-gate bipolar transistor, or IGBT transistor, a thyristor, a GTO (gate turn-off) thyristor, a cascode assembly, a JFET (junction field-effect transistor) transistor, or any type of switch able to be used for a switching cell 20 as described above.

More precisely, if each switch 21, 22 is a MOSFET transistor, the drain of the high-side switch 21 is connected to the high point PH, and the gate of the high-side switch 21 is connected to the first connection terminal B1 by a first wired link L1.

The source of the high-side switch 21 is connected to the drain of the low-side switch 22 via an intermediate wired link Li.

The intermediate wired link Li comprises a fourth connection terminal B4 and a fifth connection terminal B5. The fourth terminal B4 is positioned closer to the high-side switch 21. The fifth terminal B5 is positioned between the fourth terminal B4 and the low-side switch 22.

The source of the high-side switch 21 is connected to the second connection terminal B2 by a second wired link L2. More precisely, the second wired link L2 is used to connect the fourth connection terminal B4 and the second connection terminal B2.

Boot Circuit

The electronic circuit 10 also comprises a boot circuit 40. The boot circuit 40 comprises a capacitor $C_{40}$ and a diode $D_{40}$. The capacitor $C_{40}$ is commonly referred to as a "bootstrap" capacitor by those skilled in the art. Similarly, the diode $D_{40}$ is commonly referred to as a "bootstrap" diode by those skilled in the art.

The capacitor $C_{40}$ is connected between the third terminal B3 and the source of the high-side switch 21 by a third wired link L3. More precisely, the third wired link L3 is used to connect the capacitor $C_{40}$ between the third connection terminal B3 and the fifth connection terminal B5. In other words, the third wired link L3 comprises a first portion that is used to connect the capacitor $C_{40}$ to the third connection terminal B3 and a second portion that is used to connect the capacitor $C_{40}$ to the fifth connection terminal B5.

The fourth connection terminal B4 and the fifth connection terminal B5 therefore correspond in particular to connection points.

The diode $D_{40}$ is connected firstly to the capacitor $C_{40}$ and secondly to an auxiliary power supply device that is able to provide an auxiliary supply voltage $V_{aux}$. More precisely, the anode of the diode $D_{40}$ is connected to the auxiliary power supply device and the cathode of the diode $D_{40}$ is connected to the capacitor $C_{40}$.

The diode $D_{40}$ is also used, when the low-side switch 22 is closed (and the high-side switch 21 is open), to allow the current to flow from the auxiliary power supply in order to charge the capacitor $C_{40}$.

When the high-side switch 21 is closed (and the low-side switch 22 is open), the voltage in the intermediate wired link Li is equal to the voltage at the high point PH. The voltage in the intermediate wired link Li can therefore be high, of the order of several hundred volts. The diode $D_{40}$ is used to prevent the high voltage in the intermediate wired link Li from being connected to the auxiliary power supply device. The diode $D_{40}$ is therefore used in this case to protect the auxiliary power supply device.

Wired Link

More precisely, the first wired link L1, the second wired link L2, the third wired link L3 and the intermediate wired link Li each correspond to a printed electronic track on the electronic circuit 10. Preferably, each wired link corresponds to a substantially linear track.

The portion of the track of the second wired link L2 extending from the fourth terminal B4 and the track corresponding to the second portion of the third wired link L3 extending from the fifth terminal B5 extend substantially parallel with respect to one another. Furthermore, the fourth terminal B4 and the fifth terminal B5 are spaced apart by a minimum distance. The minimum distance is defined according to the type of switch 21, 22, the power involved, the frequency of the signals transmitted by the switching cell 20, the slew rate of the switching cell 20 and the control signal of each switch 21, 22.

The third wired link L3 is therefore characterized in that it is separated and spaced apart from the second wired link L2.

The electronic track corresponding to the third wired link L3 is characterized in that it is not in contact with the electronic track corresponding to the second wired link L2. The second wired link L2 and the third wired link L3 are separate from one another.

Furthermore, the first portion of the third wired link L3 can also extend perpendicularly to the second wired link L2 in order to connect the capacitor $C_{40}$ and the third terminal B3.

Figure 4:
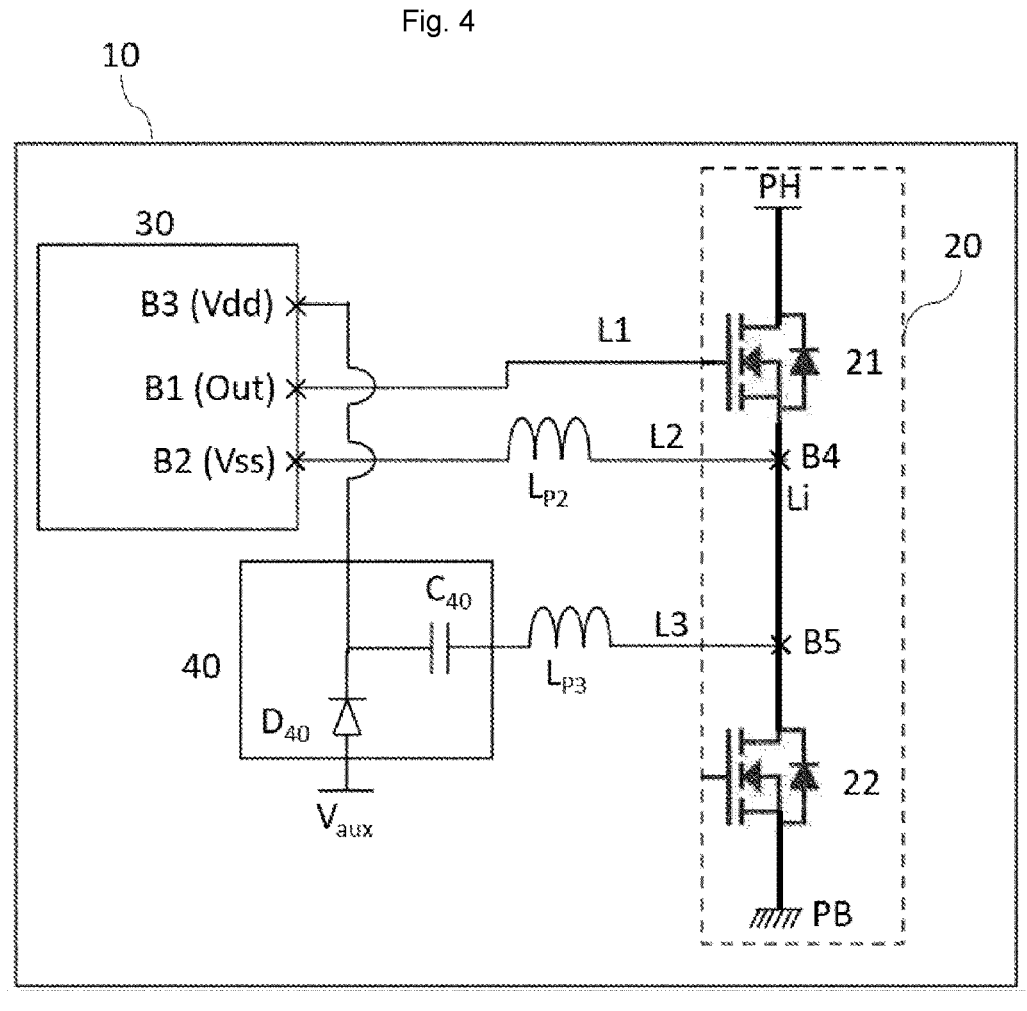
FIG. 4 shows the equivalent circuit of the electronic circuit according to FIG. 3.

With reference to FIG. 4, the equivalent circuit of the switching cell 20 in operation will now be described.

The second wired link L2 generates a first parasitic inductance $L_{P2}$. The third wired link L3 generates a second parasitic inductance $L_{P3}$.

However, the first parasitic inductance $L_{P2}$ only influences the part of the electrical circuit 10 comprising the high-side switch 21. The second parasitic inductance $L_{P3}$ only influences the part of the electrical circuit 10 comprising the low-side switch 22 and the capacitor $C_{40}$.

The parasitic inductances $L_{P2}$, $L_{P3}$ therefore do not influence the whole electrical circuit 10. This simplifies in particular the parameterization of the values of each component used in the electrical circuit 10. Indeed, the parameterization of the part of the switching cell 20 comprising the high-side switch 21 is only influenced by the first parasitic inductance $L_{P2}$, and the parameterization of the part of the switching cell 20 comprising the low-side switch 22 is only influenced by the second parasitic inductance $L_{P3}$.

The electronic circuit 10 has been described here in the case of an on-board charger in a vehicle. However, this type of electronic circuit could be used in other systems comprising a switching cell 20 and a boot circuit 40 as described above, installed in a vehicle or otherwise.

The invention claimed is:

1. An electronic circuit, comprising:
   a. a switching cell comprising a first switch, referred to as a "high-side" switch, and a second switch, referred to as a "low-side" switch, that are connected to one another by an intermediate wired link, the high-side switch also being connected to a DC supply voltage, and the low-side switch also being connected to a ground,
   b. a control module for controlling the switching cell, said control module comprising a first connection terminal, a second connection terminal and a third connection terminal,
   c. a control capacitor,
   d. said intermediate wired link comprising a fourth connection terminal and a fifth connection terminal,
   e. a first wired link configured to connect the first connection terminal of the control module to the first switch,
   f. a second wired link configured to connect the second connection terminal and the fourth connection terminal, and
   g. a third wired link that is separate from the second wired link and configured to connect the control capacitor between the third terminal and the fifth terminal.

2. The electronic circuit as claimed in claim 1, wherein each wired link extends in a substantially linear manner over a surface of said electronic circuit.

3. The electronic circuit as claimed in claim 1, wherein a first portion of the second wired link and a portion of the third wired link extend linearly and parallel with respect to one another and are spaced apart by a predefined minimum distance.

4. The electronic circuit as claimed in claim 1, wherein the intermediate wired link extends linearly between the high-side switch and the low-side switch, the fourth connection terminal is positioned on the intermediate wired link so as to be positioned closer to the high-side switch, and the fifth connection terminal is positioned so as to be placed between the fourth connection terminal and the low-side switch.

5. The electronic circuit as claimed in claim 4, wherein the fourth connection terminal and the fifth connection terminal are spaced apart by a distance at least equal to the predefined minimum distance.

6. The electronic circuit as claimed in claim 1, wherein each wired link corresponds to a printed electronic track on the electronic circuit.

7. The electronic circuit as claimed in claim 1, wherein each switch corresponds to a transistor.

8. An on-board charger comprising a converter comprising at least one electronic circuit as claimed in claim 1.

9. A motor vehicle comprising an on-board charger as claimed in claim 8.

10. The electronic circuit as claimed in claim 2, wherein a first portion of the second wired link and a portion of the third wired link extend linearly and parallel with respect to one another and are spaced apart by a predefined minimum distance.

11. A motor vehicle comprising an electronic circuit as claimed in claim 1.

\* \* \* \* \*